(12) United States Patent
Lee

(10) Patent No.: US 6,208,198 B1
(45) Date of Patent: Mar. 27, 2001

(54) DRAIN VOLTAGE PUMPING CIRCUIT

(75) Inventor: Jong Seuk Lee, Yongin-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/428,423

(22) Filed: Oct. 27, 1999

(30) Foreign Application Priority Data

Oct. 27, 1998 (KR) ................................................ 98-45198

(51) Int. Cl.[7] .................................................. G05F 3/02
(52) U.S. Cl. ............................................................ 327/536
(58) Field of Search .................................. 327/534, 535, 327/536

(56) References Cited

U.S. PATENT DOCUMENTS

| | | | |
|---|---|---|---|
| 4,888,734 | 12/1989 | Lee et al. ............................. | 365/185 |
| 5,227,652 | 7/1993 | Frerichs ................................ | 257/321 |
| 5,278,785 | 1/1994 | Hazani .................................. | 365/182 |
| 5,602,775 | 2/1997 | Vo ..................................... | 365/185.01 |
| 5,767,735 * | 6/1998 | Javanifard et al. ................... | 327/536 |
| 5,768,188 | 6/1998 | Park et al. ........................ | 365/185.03 |
| 5,790,456 | 8/1998 | Haddad ............................. | 365/185.17 |
| 5,818,766 * | 10/1998 | Song ................................ | 365/189.11 |
| 5,852,578 | 12/1998 | Hoang ............................... | 365/185.28 |
| 5,909,141 * | 6/1999 | Tomishima ........................... | 327/536 |
| 6,018,264 * | 1/2000 | Jin ...................................... | 327/536 |
| 6,128,242 * | 10/2000 | Banba et al. ........................ | 365/226 |

FOREIGN PATENT DOCUMENTS

| | | |
|---|---|---|
| 6-77437 | 3/1994 | (JP) . |
| 8-235886 | 9/1996 | (JP) . |
| 9-102555 | 4/1997 | (JP) . |
| 9-186256 | 7/1997 | (JP) . |
| 9-231778 | 9/1997 | (JP) . |
| 10-32272 | 2/1998 | (JP) . |
| 10-65114 | 3/1998 | (JP) . |
| 10-74850 | 3/1998 | (JP) . |
| 10-92958 | 4/1998 | (JP) . |
| 10-188587 | 7/1998 | (JP) . |

* cited by examiner

Primary Examiner—Jeffrey Zweizig
(74) Attorney, Agent, or Firm—Pennie & Edmonds LLP

(57) ABSTRACT

A drain voltage pumping circuit comprising: a detection unit for outputting program control signal by detecting the number of bits for programming before programming memory cells on a memory cell array; and a drain voltage pumping unit for generating a drain voltage according to the program control signals of the detection unit.

9 Claims, 3 Drawing Sheets

DRAIN VOLTAGE PUMPING CIRCUIT

BACKGROUND OF THE INVENTION

1. Field of the Invention

The present invention relates to a drain voltage pumping circuit, and more particularly to a drain voltage pumping circuit to reduce current dissipation in program operation by detecting the number of bits for programming at the time of program operation on a flash memory cell and by allowing drain pumping voltage control depending on the number of cells for programming.

2. Description of the Prior Art

Generally, memory cells in a flash memory are by applying high voltage, for example, 8 through 9V to a control gate and the supply voltage, for example, 4 through 5V to a drain electrode. For supplying such high voltage or supply voltage, drain voltage pumping circuits are used.

FIG. 1 is a typical drain voltage pumping circuit. A drain voltage pumping unit 2 for programming memory cells in a memory cell array 1 comprises a ring oscillator 3 and a pumping unit 4.

Operation of a typical drain voltage circuit constituted as described above will be explained with reference to FIG. 2A and FIG. 2B.

FIG. 2A is a detailed circuit of the ring oscillator. The ring oscillator comprises: a NAND gate 5 to use enable signals En as input; a first delay unit 6 to delay output of the NAND gate 5; a first inverter I1 to inverse output of the first delay unit 6; a second delay unit 7 to delay output of the first inverter I1; a second inverter I2 to invent output of the second delay unit 7 and provide the output to a remain input terminal of the NAND gate 5; a third inverter I3 for generating a first control signal $\phi1$ by inversing output of the second inverter I2; and a fourth inverter I4 for generating a second control signal $\phi2$ by inversing output of the third inverter I3.

FIG. 2B is a detailed circuit of pumping unit. The pumping unit comprises: a first NMOS transistor and a second NMOS transistor N1 and N2 connected in parallel between the supply power Vcc and the first node K1; a first capacitor and a second capacitor C1 and C2 to use first and second control signals $\phi1$ and $\phi2$ of the ring oscillator as input; and a third NMOS transistor N3 connected between the first node K1 and the output terminal Out.

As described above, a typical drain voltage pumping circuit programmed 8 bits or 16 bits at the same time, using one pumping device, as shown in FIG. 2B.

For example, if a pumping circuit is constituted for programming when the number of bits for programming is assumed to be 16, excessive power dissipation occurs in programming 8 bits. Also, if a pumping circuit is constituted for programming when the number of bits for programming is assumed to be 8, enough program pumping output can not be obtained since current supply is small in 16 bits programming.

SUMMARY OF THE INVENTION

Accordingly, it is an object of the present invention to provide a drain voltage pumping circuit to settle above problems by detecting the number of bits for programming at the time of programming in flash memory cells and adjusting drain pumping voltage depending on the number of cells for programming.

A drain voltage pumping circuit in accordance with the present invention to achieve the object as described above comprises: a detection unit for outputting program control signal by detecting the number of bits for programming before programming memory cells on a memory cell array; and a drain voltage pumping unit for generating a drain voltage according to the program control signals of the detection unit.

Also, a drain voltage pumping circuit comprises: a detection circuit for detecting the number of bits to be programmed of a plurality of bits and for generating a plurality of program control signals according to the number of bits; and a drain voltage pumping unit having a ring oscillator and a pumping circuit, with the ring oscillator generating pulse signals having cycles which are different from each other in respond to the program control signal and the pumping circuit generating a drain voltage according to a pulse signal from the ring oscillator.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Figure 1:
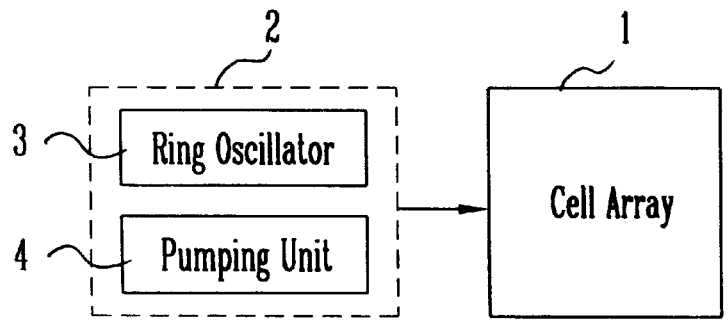
FIG. 1 is a block diagram of a conventional drain voltage pumping circuit.
Figure 2A:
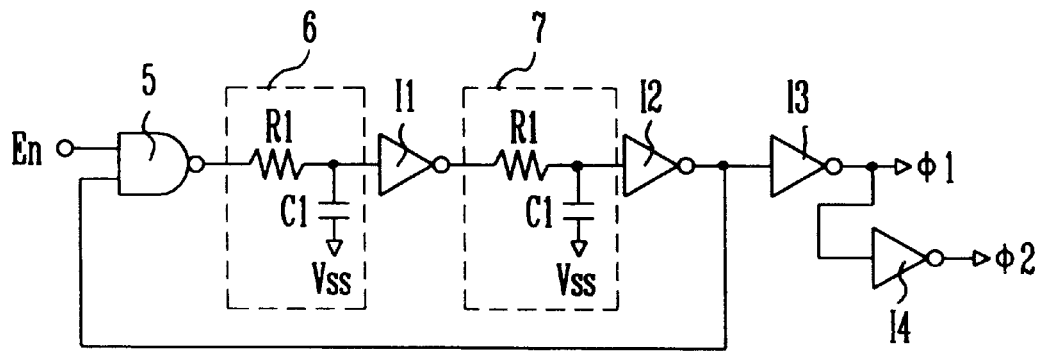
FIG. 2A is a detailed circuit of a ring oscillator of FIG. 1.
Figure 2B:
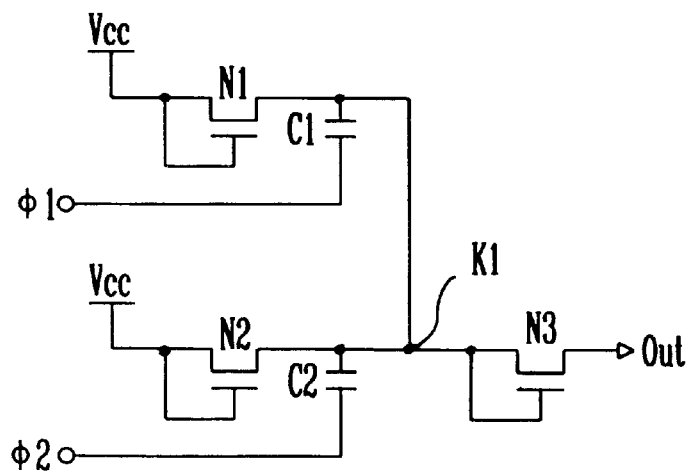
FIG. 2B is a detailed circuit of a pumping unit of FIG. 1.
Figure 3:
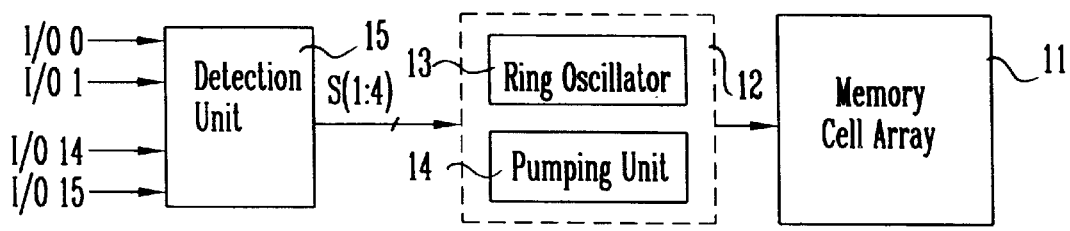
FIG. 3 is a block diagram of a drain voltage pumping circuit in accordance with the present invention.

FIG. 3, is a drain voltage pumping circuit in accordance with the present invention. The drain voltage pumping circuit comprises a memory cell array 11 that multiple memory cells are constituted in a matrix type, a drain voltage pumping unit 12, and a detection unit 15.

The drain voltage pumping unit 12 for programming memory cells on the memory cell array 11 comprises a ring oscillator 13 and a pumping unit 14. The detection unit 15 detects the number of bits for programming before programming memory cells on the memory cell array 11 and outputs program control signals S1 to S4.

For example, programming is performed by generating: a first control signal S1 where the number of bits for programming is 16; a second control signal S2 where the number of bits for programming is 12; a third control signal S2 where the number of bits for programming is 8; and a fourth control signal S4 where the number of bits for programming is 4, respectively. In the above, 4 bits are used as one unit, but the unit may be adjusted depending on the program current state of chips of 8 bits or 2 bits, and so on.

Figure 4A:
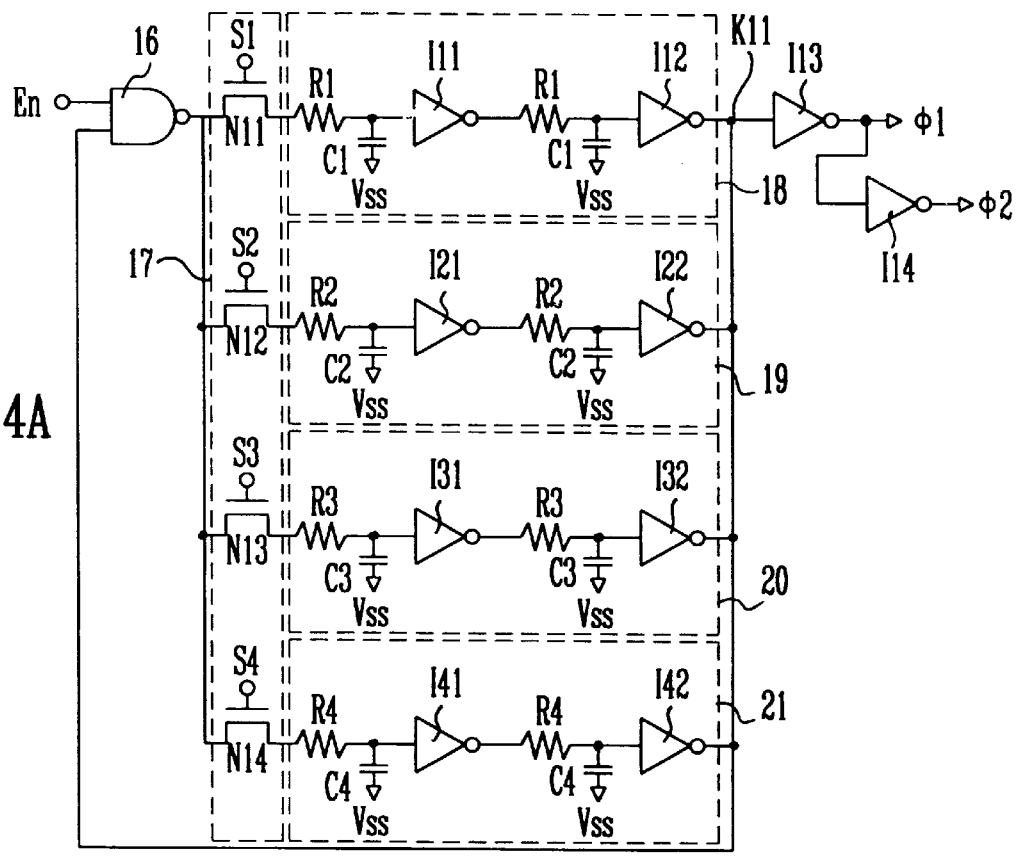
FIG. 4A is a detailed circuit of a ring oscillator of FIG. 3.

FIG. 4A is a detailed circuit of a ring oscillator in accordance with the present invention. The ring oscillator comprises: the NAND gate 16 to use enable signals En as an input; a switching unit 17 driven according to program control signals S1 to S4 of the detection unit 15; first through fourth delay units 18 through 21, connected in parallel between the switching unit 17 and the first node K11, delaying output of the NAND gate provided through the switching unit 17 to each different cycle, and for providing the output as another input of the NAND gate 16; a first inverter I13 for outputting a first control signal $\phi 1$ by inversing output of the first through fourth delay units 18 through 21; and a second inverter I14 for outputting second control signal $\phi 2$ by inversing output of the first inverter I13.

The switching unit 17 comprises first through fourth NMOS transistors N11 to N14, connected between output of the NAND gate 16 and first through fourth delay unites 18 through 21, and adjusted by first through fourth program control signals S1 through S4 generated by the detection unit 15.

As described above, the cycle of a ring oscillator is adjusted by first through fourth program control signals S1 through S4 generated in a detection unit 15.

A ring oscillator comprises an odd number of inverters and its output is adjusted by an internal delay circuit. For example if a delay time gets shot, the cycle gets short, and gets longer if a delay time increases.

Figure 4B:
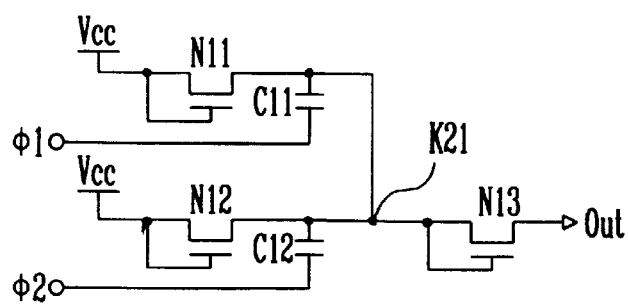
FIG. 4B is a detailed circuit of a pumping unit of FIG. 3.

FIG. 4B, is a detailed circuit of a pumping unit. The pumping unit comprises a first NMOS transistor and a second NMOS transistor N11 and N12 connected in parallel between the power supply Vcc and the first node K21; a first capacitor C1 and a second capacitor C2 to use first and second control signals $\phi 1$ and $\phi 2$ of the ring oscillator as input: and a third NMOS transistor N13 connected between the first node K21 and the output terminal Out.

Figure 5A:
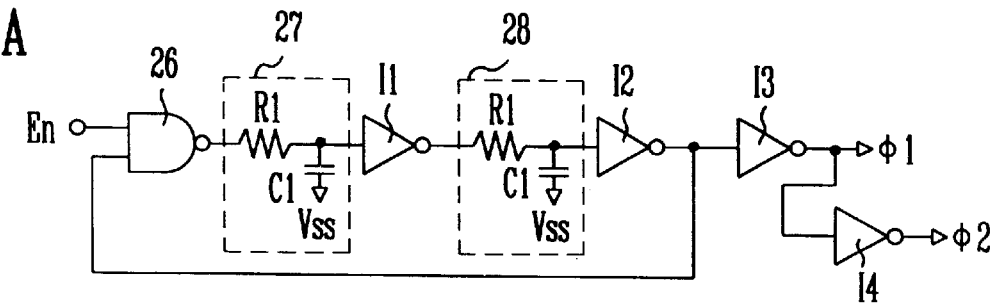
FIG. 5A is another embodiment of a ring oscillator of FIG. 3.

FIG. 5A is a detailed circuit of a ring oscillator. The ring oscillator comprises: a NAND gate 26 to use enable signals En as input; a first delay unit 27 to delay output of the NAND gate 26; a first inverter I1 to inverse output of the first delay unit 27; a second delay unit 28 to delay output of the first inverter I1; a second inverter I2 to provide the output to another input terminal of the NAND gate 26 by inversing output of the second delay unit 28; a third inverter I3 for outputting first control signal $\phi 1$ by inversing output of the second inverter I2; and a fourth inverter I4 for outputting second control signal $\phi 2$ by inversing output of the third inverter I3.

Figure 5B:
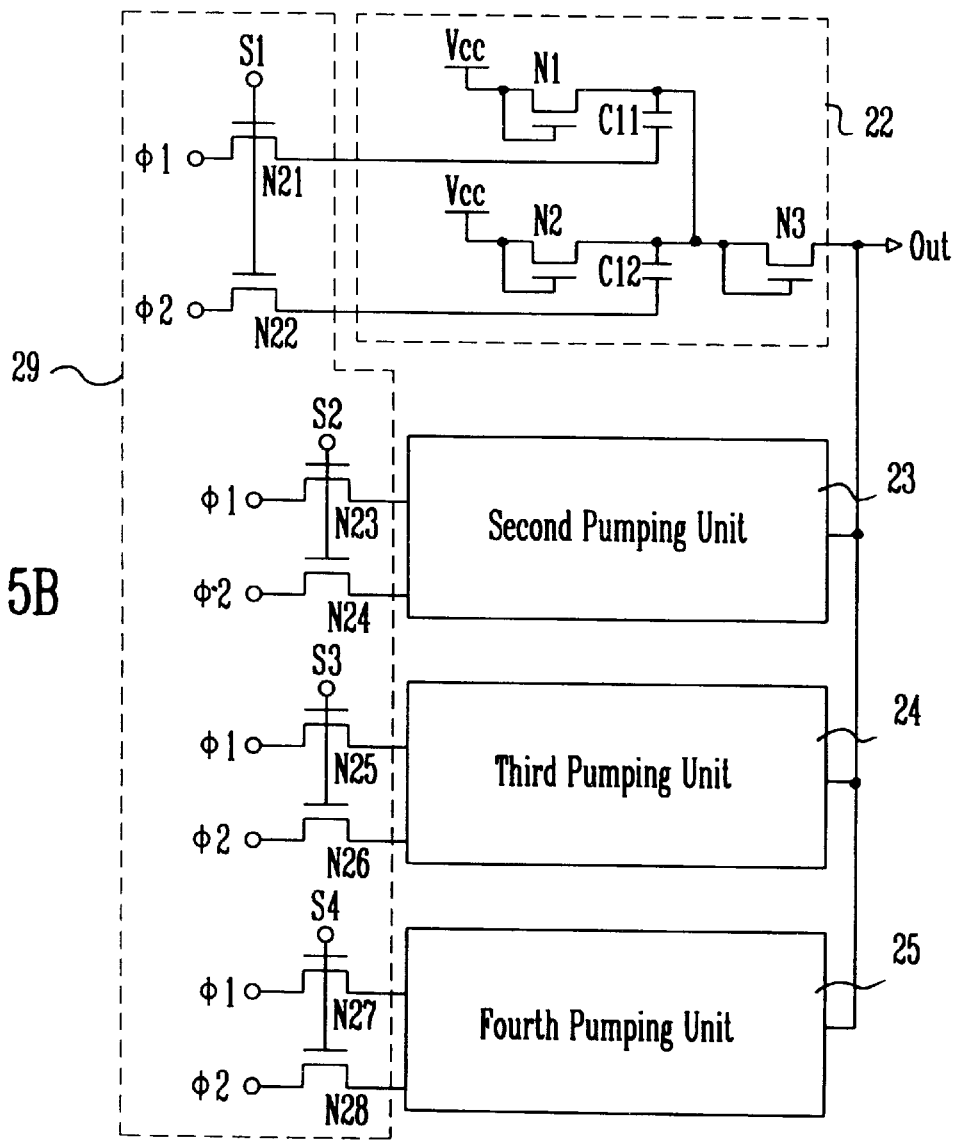
FIG. 5B is another embodiment of a pumping unit of FIG. 3.

FIG. 5B, is a detailed circuit of a pumping unit in accordance with the present invention. The pumping unit comprises: a switching unit 29 driven by program control signals S1 to S4 of a detection unit; and first through fourth pumping unit 22 through 25, connected in parallel between the switching unit 29 and the output terminal Out, and for outputting drain voltage of each different size according to first and second control signals $\phi 1$ and $\phi 2$ of the ring oscillator supplied through the switching unit 29.

As described above, the present invention has a property that voltage and current changes depending on the cycle of a ring oscillator, and the faster the cycle is, the larger voltage and current is made. Using such a property, the present invention decides the number of bits for programming before programming, and reduces unnecessary power dissipation by adjusting the drain voltage pumping cycle according to the number of bits for programming.

For example, for programming many bits, enough voltage and current is provided by making the rapid cycle of a ring oscillator.

Many methods can be used to change the drain voltage pumping cycle. One of them is to connect a delay device between inverters of a ring oscillator and to change the cycle. For example, to get enough voltage and current where the number of bits for programming is 16, the cycle of a delay device should be short relatively. On the contrary, where the number of bits for programming is shorter, the cycle of a delay device should be longer.

As described above, the present invention has an excellent effect to reduce power dissipation in programming, by detecting the number of bits for programming at the time of program operation in flash memory cells and by adjusting drain pumping voltage depending on the number of cells for programming.

While the present invention has been described and illustrated herein with reference to the certain preferred embodiment thereof, those skilled in the art will recognize the many modifications and enhancements in form and details which can be made therein without departing from the true spirit and scope of the invention.

What is claimed is:

1. A drain voltage pumping circuit comprising:
    a detection unit for outputting program control signal by detecting the number of bits for programming before programming memory cells on a memory cell array; and
    a drain voltage pumping unit for generating a drain voltage according to said program control signals of said detection unit.

2. The circuit of claim 1, wherein said drain voltage pumping unit comprises;
    a ring oscillator for outputting control signals of each different cycle; and
    a pumping unit for outputting the drain voltage for programming the memory cells on the memory cell array according to output of said ring oscillator.

3. The circuit of claim 2, wherein said ring oscillator comprises:
    a NAND gate to use enable signals as any input;
    a switching unit driven according to said program control signals of said detection unit;
    first through fourth delay units, connected in parallel between said switching unit and a first node, delaying output of said NAND gate provided through said switching unit to each different cycle, and for providing the output as another input of said NAND gate;
    a first inverter for outputting a first control signal by inversing output of said first through fourth delay units; and
    a second inverter for outputting a second control signal by inversing output of said first inverter.

4. The circuit of claim 3, wherein said switching unit comprises first through fourth NMOS transistors, connected respectively between output of said NAND gate and first through fourth delay units, and adjusted by first through fourth program control signals generated by said detection unit.

5. The circuit of claim 2, wherein said pumping unit comprises:
    a switching unit driven by first and fourth program control signals of said detection unit; and
    first through fourth pumping unites, connected in parallel between said switching device and the output terminal, and for outputting the drain voltage of each different size according to first and second control signals of said ring oscillator provided through said switching unit.

6. A drain voltage pumping circuit comprising:

a detection circuit for detecting the number of bits to be programmed of a plurality of bits and for generating a plurality of program control signals according to the number of bits; and a drain voltage pumping unit having a ring oscillator and a pumping circuit, with the ring oscillator generating pulse signals having cycles which are different from each other in respond to said program control signal and said pumping circuit generating a drain voltage according to a pulse signal from said ring oscillator.

7. The circuit of claim 6, wherein said ring oscillator comprises:

a NAND gate to use enable signals as any input;

a switching unit driven according to said program control signals of said detection unit;

first through fourth delay units, connected in parallel between said switching unit and a first node, delaying output of said NAND gate provided through said switching unit to each different cycle, and for providing the output as another input of said NAND gate;

a first inverter for outputting a first control signal by inversing output of said first through fourth delay units; and a second inverter for outputting a second control signal by inversing output of said first inverter.

8. The circuit of claim 7, wherein said switching unit comprises first through fourth NMOS transistors, connected respectively between output of said NAND gate and first through fourth delay units, and adjusted by first through fourth program control signals generated by said detection unit.

9. A drain voltage pumping circuit comprising:

a detection circuit for detecting the number of bits to be programmed of a plurality of bits and for generating a plurality of program control signals according to the number of bits; and a drain voltage pumping unit having a ring oscillator and a pumping circuit, wherein said ring oscillator generates a pulse signal having a constant period and said pumping circuit have a plurality of pumping circuits which are selectively operated by said program signals and said pulse signal, thereby generating a drain voltage.

* * * * *